United States Patent [19]

Matsutani et al.

[11] Patent Number: 4,592,895

[45] Date of Patent: Jun. 3, 1986

[54] SINGLE CRYSTAL PULLING SYSTEM

[75] Inventors: Kinya Matsutani; Katsutoki Sasaki, both of Yokohama, Japan

[73] Assignee: Kabushiki Kaisha Toshiba, Kawasaki, Japan

[21] Appl. No.: 634,072

[22] Filed: Jul. 25, 1984

[30] Foreign Application Priority Data

Jul. 26, 1983 [JP] Japan ................................. 58-136605

[51] Int. Cl.⁴ ............................................. C30B 15/20
[52] U.S. Cl. .................................... 422/106; 422/108; 422/249; 156/601; 156/617 SP; 156/DIG. 80
[58] Field of Search ....................... 422/106, 108, 249; 156/601, 617 SP, DIG. 80

[56] References Cited

U.S. PATENT DOCUMENTS 3,291,650 12/1966 Dohmen et al. ..................... 156/601
3,882,319 5/1975 Clement et al. ..................... 156/601
3,998,598 12/1976 Bonora ................................ 156/601

FOREIGN PATENT DOCUMENTS 145407 12/1980 Fed. Rep. of Germany ...... 156/601

OTHER PUBLICATIONS

Charles Cohen, Magnetic Field Breeds Skylab-Like Semiconductors, Electronics, Jul. 3, 1980, pp. 83–84.
Japanese Journal of Applied Physics, vol. 22, No. 6, Jun., 1983, pp. L325–L327, "Electrical Resistivity of Undoped GaAs Single Crystals Grown by Magnetic Field Applied LEC Technique", Kazutaka Terashima et al.
Electrochemical Society Meeting, vol. 83-1, Abstract No. 326, May 1983 "Growth and Characterization of Undoped GaAs Single Crystals by a Transverse Magnetic Field Applied LEC Technique", K. Terashima and T. Fukuda.
Nikkei Electronics, 1980, pp. 154–176.

Primary Examiner—David L. Lacey
Attorney, Agent, or Firm—Oblon, Fisher, Spivak, McClelland & Maier

[57] ABSTRACT

A single crystal pulling system including a single crystal pulling apparatus, an electromagnet, and an electromagnet moving mechanism, wherein the single crystal pulling apparatus pulls a seed crystal from a single crystal material melt contained in a crucible at a specified constant speed. The electromagnet is disposed at the outer periphery of the crucible so as to apply a predetermined required strength of magnetic field to the crystal-melt interface of the melt. The magnet moving mechanism moves the electromagnet in a vertical direction with respect to the crucible as the level of the crystal-melt interface is lowered during seed growth so that a predetermined required strength of magnetic field is always applied to the crystal-melt interface.

6 Claims, 7 Drawing Figures

SINGLE CRYSTAL PULLING SYSTEM

BACKGROUND OF THE INVENTION

1. Field of the Invention:

This invention relates to a single crystal pulling system of the type including electromagnets which apply a magnetic field to a single crystal material melt.

2. Description of the Prior Art:

Presently, in the semiconductor device industry there are primarily two methods for producing a single crystal Si or Ga-As. One method is the Czochralski method, and the other method is Free-Zone method. Most of single crystal LSI wafer materials are produced by the Czochralski method.

A conventional single crystal pulling system for the Czochralski method will be described.

A crucible filled with a single crystal material melt (hereinafter simply referred to as melt) is heated by a heater such that the single crystal material is invariably maintained in a melt state. A seed crystal is inserted into the melt, and when the seed crystal is pulled from the melt at a specific constant speed by means of a pulling mechanism, a single crystal is created through growth of the seed crystal at a boundary layer of the crystal-melt interface. In this process, liquid movements, i.e., thermal convections induced by heat of the heater, are somewhat developed.

Why such thermal convections are developed may be explained as follows. Thermal convections generally occur when the balance between buoyancy caused by fluid thermal expansion and fluid viscosity is destroyed. The balance between the buoyancy and the viscosity can be expressed by a dimensionless quantity which is called the Grashof number $N_{Gr}$, as follows:

$$N_{Gr} = g\alpha\Delta T\, R^3/\nu^3$$

where:
g: gravitational acceleration
α: thermal expansion coefficient of the melt
ΔT: radial temperature difference in the crucible
R: crucible radius
ν: dynamic viscosity coefficient of the melt In general, when the Grashof number exceeds a certain critical value determined by various factors, such as geometrical dimensions of the melt, thermal boundary conditions and so forth, thermal convections occur within the melt. Usually, the thermal convections of the melt attain a turbulent flow state when $N_{Gr} > 10^5$, and a disturbance state when $N_{Gr} > 10^9$. In the case of the present melt condition under which a single crystal with a diameter of 3 to 4 inches is pulled, the Grashof number becomes $N_{Gr} > 10^9$ (according to the above-described equation for $N_{Gr}$). As a result, there is developed a disturbance state within the melt, and a ruffled state is developed at the surface of the melt, i.e., at the crystal-melt boundary interface layer.

In the presence of the thermal convections of such disturbance state, temperature fluctuations within the melt, particularly at the crystal-melt boundary interface layer, become drastic. In turn, there exist drastic fluctuations in position and time elapse at the crystal-melt boundary interface. Consequently, microscopic remelting of the crystal during growth conspicuously occurs, and within the grown single crystal, there are developed dislocation loops, lamination defects and so forth. Further, such defective portions are developed in a non-uniform fashion with respect to the pulling direction of the single crystal because of irregular fluctuations at the crystal-melt boundary interface layer. Moreover, impurities are resolved from the inner surface of the crucible into the melt due to the chemical change between the crucible and the melt (particularly a high temperature melt of approximately 1500° C., for example) which are in contact with each other. Such impurities are carried by the thermal convections resulting in an entire dispersion throughout the melt.

The impurities become nuclei, and within the single crystal, there are developed dislocation loops, lamination defects, growth stripes and so forth, whereby the quality of the single crystal is deteriorated. Therefore, in the process of manufacturing LSI wafers from the single crystal, the wafers that include such defective portions exhibit deteriorated electrical characteristics, to the point where they become useless and the production yield is therefore lowered.

In the future, single crystals are increasingly required to be greater in diameter. However, as can be seen from the equation for the Grashof number, the greater the crucible radius, the greater the Grashof number, so that the thermal convections of the melt become more violent. Thus the quality of the single crystal further deteriorates.

In recent years, it has been proposed to apply a direct current magnetic field to the melt in order to suppress the above-described thermal convections, thereby allowing single crystals to be pulled under a growth condition that is thermally and chemically close to the equilibrium state, as described in "NIKKEI ELECTRONICS" (1980.9.15, pp. 154–176).

FIG. 1 shows a schematic configuration of the conventional single crystal pulling system utilizing application of a magnetic field.

In FIG. 1, a crucible 2 filled with a single crystal material melt 1 (hereinafter simply referred to as a melt) is heated by a heater 3 such that the single crystal material is invariably maintained in a melt state. A seed crystal 4 is inserted into the melt 1, and when the seed crystal 4 is pulled from the melt 1 at a specific constant speed by means of a pulling mechanism 5, a single crystal 7 is created through growth of the seed crystal 4 at the boundary layer of the crystal-melt interface 6.

In the outer periphery of a crucible 2 there is installed an electromagnet 10 so as to apply a uniform magnetic field to the melt 1 in the direction 9. The melt 1 for a single crystal 7 is generally a fluid conductor having an electrical conductivity σ, so that when such fluid moves by the effect of thermal convections 8, the fluid moving in a direction which is not in parallel with the direction 9 undergoes magnetic resistive force according to Lenz's law, and this prevents the movement of the thermal convections 8.

In general, magnetic resistive force obtained by application of magnetic field, i.e., magnetic viscosity coefficient $\nu_{eff}$, can be expressed as follows:

$$\nu_{eff} = (\mu HD)^2\, \sigma/\rho$$

where
μ: magnetic permeability of the melt
H: magnetic field strength
D: crucible radius
σ: electrical conductivity of the melt
ρ: density of the melt.

As can be seen from this equation, the greater the magnetic field strength H, the greater the magnetic viscosity efficient $v_{eff}$. This causes $v$ in the aforementioned equation for the Grashof number to be increased, thereby causing the Grashof number thereof to be drastically decreased. Thus a certain strength of magnetic field can reduce the Grashof number to a value below the specified critical value. Consequently, the thermal convections 8 of the melt 1 are completely suppressed. Suppression of the thermal convections 8 by the virtue of application of magnetic field minimizes impurities within the single crystal 7, development of dislocation loops, and development of defective growth stripes. This also serves to create the single crystal 7 of uniform quality with respect to the pulling direction, thereby enhancing the quality of the single crystal 7 and its production yield as well.

FIG. 2 shows the relationship between the magnetic field strength (abscissa) and the concentration of impurities within the single crystal 7 (ordinate). In FIG. 2, when the magnetic field strength becomes greater than $H_1$, the impurity concentration commences to decrease and becomes minimum at a certain magnetic field strength such as $H_2$. This is because at the magnetic field strength $H_2$, the Grashof number of the melt 1 becomes below the critical value, whereby the thermal convections 8 of the melt 1 are completely suppressed. Thus, even when the magnetic field strength is increased greater than $H_2$, the impurity concentration is not further lowered because the thermal convections 8 have already been suppressed. It is useless to increase the magnetic field strength greater than $H_2$.

As described above, higher concentration of impurities causes dislocation loops and defective growth stripes. Therefore, in order to create a single crystal of high quality, the concentration of impurities should be maintained within a hatched portion between the lines $B_1$ and $B_2$ shown in FIG. 2.

On the other hand, when the single crystal 7 is being pulled, the melt 1 within the crucible 2 decreases by the quantity spent for growth of the single crystal 7, so that the crystal-melt interface 6 lowers. To invariably apply a magnetic field of strength above $H_2$ to the crystal-melt interface 6 in the process of pulling the single crystal 7, there is installed an electromagnet 10 capable of applying a magnetic field of strength above $H_2$ to the entire space of the crucible 2. Thus, at the center of the crucible 2 where magnetic field strength becomes maximum, there exists a magnetic field of $H_3 > H_2$ and the margin of such magnetic field strength becomes excessive. The electromagnet 10 is therefore, required to be relatively greater in field strength, and also adds further expense to the manufacturing cost. Further, because of its relatively greater magnetic field strength, the affected region thereof becomes greater. As a result, the magnetic field leakage of the electromagnet 10 adversely affects the pulling mechanism 5, particularly on electric motors and the like mounted therein.

Furthermore, the single crystal pulling system necessitates cleaning of the crucible 2 at every termination of pulling the single crystal 7 before replenishment of the crucible 2 with a new single crystal material. However, the conventional single crystal pulling system has such a configuration that the electromagnet 10 is fixed in the outer periphery of the crucible 2, so that when cleaning the inside of the crucible 2, the electromagnet 10 needs to be removed from the system, and this necessitates cumbersome and complicated procedures.

SUMMARY OF THE INVENTION

Accordingly, it is an object of this invention to provide a novel single crystal pulling system capable of applying a minimal required magnetic field strength to a crystal-melt interface for suppressing the thermal convections.

Another object of this invention is to provide a novel single crystal pulling system capable of using an electromagnet which has minimal ampere-turns, is smaller in size, and is manufactured at lower cost.

Another object of this invention is to provide a novel single-crystal pulling system capable of facilitating cleaning of the inside of the crucible of the system.

These and other objects are achieved according to one embodiment of this invention, by providing a single crystal pulling system having a single crystal pulling mechanism, an electromagnet and a magnetic moving mechanism, wherein the single crystal pulling apparatus grows a single crystal at a crystal-melt interface of a melt when a seed crystal is inserted into a single crystal material melt filled within a crucible heated by a heater, and thereafter the seed crystal is pulled from the melt at a specified constant speed by means of the pulling mechanism. The electromagnet is disposed at an outer periphery of the crucible so as to apply a predetermined required strength of magnetic field to the crystal-melt interface of the melt in a vertical direction with respect to the crucible, and the magnetic moving mechanism moves the electromagnet in a vertical direction with respect to the crucible.

According to another embodiment of this invention, there is provided a single crystal pulling system having a single crystal pulling apparatus, an electromagnet and a magnet moving mechanism, wherein the single crystal pulling apparatus grows a single crystal at a crystal-melt interface of a melt when a seed crystal is inserted into a single crystal material melt filled within a crucible heated by a heater and thereafter the seed crystal is pulled from the melt at a specified constant speed by means of a pulling mechanism. The electromagnet is of the split type and is disposed at an outer periphery of the crucible so as to apply a predetermined required strength of magnetic field to the crystal-melt interface of the melt in a horizontal direction with respect to the crucible, and the magnet moving mechanism moves the electromagnet in a vertical direction and in a horizontal direction with respect to the crucible.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
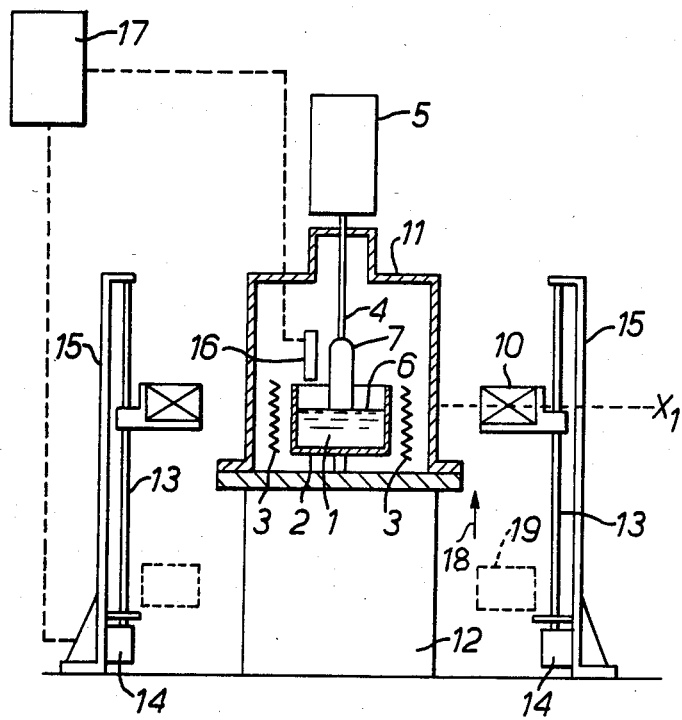
FIG. 3 is a schematic diagram illustrating one embodiment of a single crystal pulling system according to the present invention.

Referring now to the drawings, wherein like reference numerals designate identical or corresponding parts throughout the several views, and more particularly to FIG. 3 thereof, a single crystal pulling system according to the present invention will be described. On a pedestal 12, there is installed a chamber 11 that accommodates a crucible 2 filled with a melt 1, a heater 3 that heats the melt 1, and a single crystal 7 to be pulled. In the outer periphery, there is installed an electromagnet 10 to apply a magnetic field to the melt 1. The electromagnet 10 is mechanically coupled to vertical drive shafts 13 which are screw spindles or lead screws, for example. The vertical drive shafts 13 rotate so as to move the electromagnet 10 in a vertical direction, i.e., upwardly or downwardly. Here, the drive thereof may be performed either hydraulically or pneumatically or manually. The vertical drive shafts 13 are coupled to drive units 14, such as electric motors. The vertical drive mechanisms consisting of the vertical drive shafts 13 and the drive units 14 are supported by supports 15, and the electromagnet 10 is movably supported by the vertical drive shafts 13. On the other hand, within the chamber 11, there is installed a sensor 16 (such as a liquid-level meter, or a laser-based position detector) that transmits a position detecting signal to a vertical drive control apparatus 17 so as to control the drive units 14.

Figure 4:
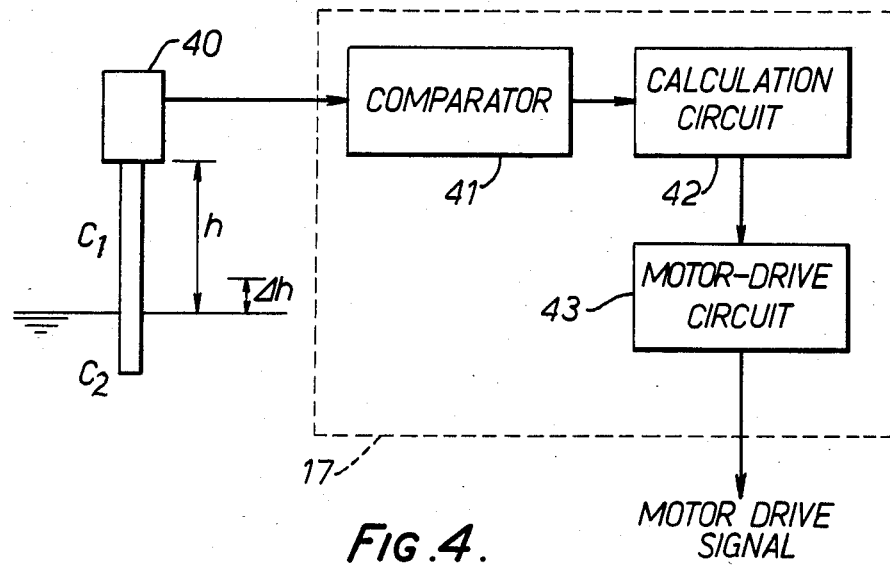
FIG. 4 is a schematic block diagram illustrating one embodiment according to the invention, in which the drive unit is controlled by use of a liquid-level meter.

Referring to FIG. 4, one example in which the drive unit 14 is controlled by use of a liquid-level meter will be described.

An electrostatic capacitance C detected by a liquid-level sensor 40 can be obtained as a resultant electrostatic capacitance of an electrostatic capacitance $C_2$ of the melt 1 and an electrostatic capacitance $C_1$ of the space thereabout. FIG. 4 schematically shows the zones having electrostatic capacitances $C_1$ and $C_2$. Here, a specified dielectric constant of the melt 1 differs significantly from that of the space thereabout, so that when a liquid level h of the melt 1 is varied, the electrostatic capacitance C is conspicuously varied. A comparator 41 compares a present electrostatic capacitance C with a previous electrostatic capacitance $C_0$ so as to produce a difference $\Delta C$ between the former and the latter. Since a difference $\Delta h$ of the liquid level can be expressed as a function of the difference $\Delta C$ of the electrostatic capacitance, a calculation circuit 42 receives the difference $\Delta C$ of the electrostatic capacitance so as to produce the difference $\Delta h$ of the liquid level. A motor drive circuit 43 feeds a motor drive signal into the drive unit 14 in such a manner that the vertical position of the electromagnet 10 is controlled to be varied, in this case lowered, by the amount of the difference $\Delta h$ of the liquid level.

Next, the operation of the above-described system will be described.

First, upon commencement of pulling the single crystal 7, the center line of the electromagnet 10 is arranged to coincide with the liquid level of the melt 1. When pulling the single crystal 7 causes the liquid level of the melt 1 to be lowered whereby the electrostatic capacitance C detected by the liquid-level sensor 40 is varied, the comparator 41 produces an output of $\Delta C = |C_0 - C|$, the difference between the present electrostatic capacitance C and the previous electrostatic capacitance $C_0$ (which means, in this case, the electrostatic capacitance upon commencement of pulling the single crystal 7). The lowered quantity $\Delta h$ of the liquid level of the melt 1 can be obtained from the difference $\Delta C$ of the electrostatic capacitance produced by the comparator 41, such that an electric motor of the drive unit 14 is driven such that the electromagnet 10 is lowered by the amount of the difference $\Delta h$. When the liquid level of the melt 1 is further lowered, the drive unit 14 is driven so as to lower the electromagnet 10 in similar manner.

As described above, the electromagnet 10 can be accurately lowered in accordance with the lowered quantity $\Delta h$ of the liquid level of the melt 1, thereby causing the center line of the electromagnet 10 to invariably coincide with the liquid level of the melt 1.

Figure 5:
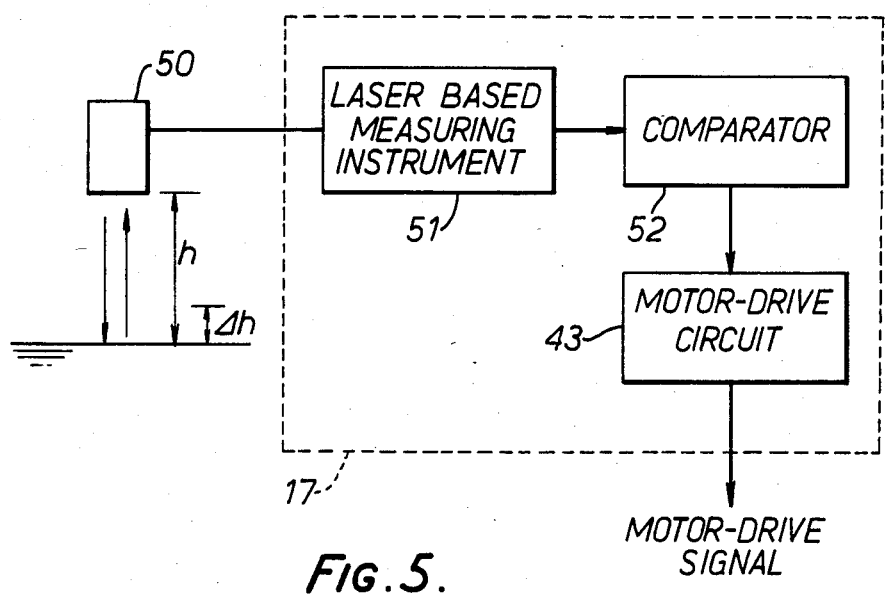
FIG. 5 is a schematic block diagram illustrating one embodiment according to the invention, in which the drive unit is controlled by use of a laser-based measuring instrument.

Next, referring to FIG. 5, one example in which the drive unit 14 is controlled by use of a laser-based measuring instrument will be described. In FIG. 5, a laser head and receiver 50 and a laser-based measuring instrument 51 detect, by virtue of Doppler effect in light, the liquid level of the melt 1. A comparator 52 compares a present liquid level h with a previous liquid level $h_0$ so as to produce a difference $\Delta h$ of the liquid level. A motor drive circuit 43 feeds a motor drive signal into the drive unit 14 in such a manner that the electromagnet 10 is controlled to be lowered by the amount of the difference $\Delta h$ of the liquid level.

Figure 1:
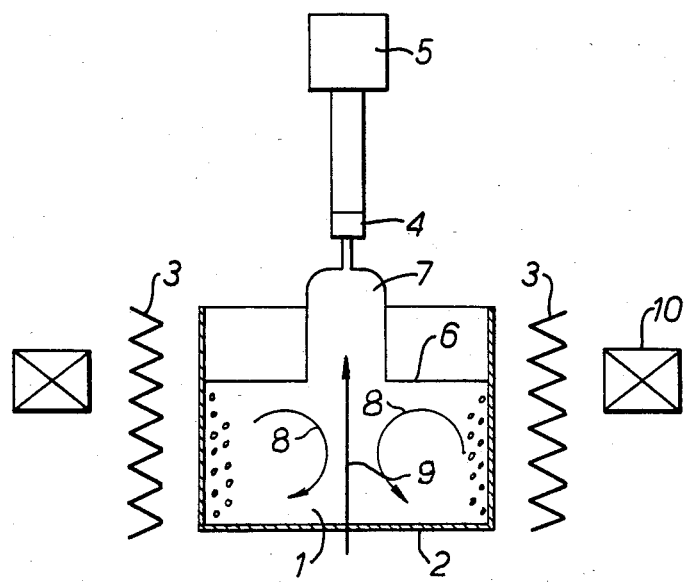
FIG. 1 is a schematic diagram illustrating the conventional single crystal pulling system.
Figure 2:
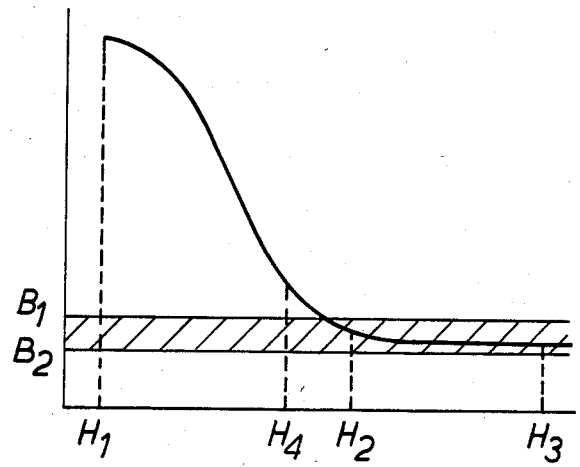
FIG. 2 is a graph illustrating the relationship between magnetic field strength and concentrations of impurities within a single crystal.

The above-described system can also provide operations similar to the example shown in FIG. 4. Namely, the electromagnet 10 can be accurately lowered in accordance with the lowered quantity $\Delta h$ of the liquid level of the melt 1, thereby causing the center line of the electromagnet 10 invariably to coincide with the liquid level of the melt 1. The electromagnets 10 are provided with coil turns and current values which are so determined as to generate a maximum magnet field strength of $H_2$ shown in FIG. 2 with respect to the melt 1.

Next, the operations of the above-described single crystal pulling system will be described. In FIG. 3, a single crystal 4 is first inserted into the melt 1, then at the commencement of pulling the single crystal 4, the electromagnets 10 are adjusted in terms of position such that their center lines $X_1$ coincide with a crystal-melt interface 6. Namely, the maximum magnetic field strength $H_2$ of the electromagnets 10 is adjusted to be applied to the crystal-melt interface 6. Thereafter, a pulling mechanism 5 is operated so as to pull the single crystal 7 at a specified constant speed. Along with growth of the single crystal 7, the melt surface, i.e., the crystal-melt interface 6 lowers. In this case, should the electromagnets 10 be fixed in position, the crystal-melt interface 6 shifts to a position below the center lines $X_1$ of the electromagnetics 10. In general, the magnetic field strength of a magnet decreases as a function of the distance from its center line, so that in this case, such a magnetic field strength of $H_4$ show in FIG. 2 would be applied to the crystal-melt interface 6. As can be seen from FIG. 2, this would cause the impurity concentration to be outside of the hatched region between the lines $B_1$ and $B_2$, thus the single crystal 7 would deteriorate in quality. In other words, the single crystal 7 grown from the crystal-melt interface 6 to which the magnetic field strength of $H_4$ is applied would become lower in quality.

Therefore, in this system, the amount of lowering, $\Delta h$, of the melt surface is detected by the sensor 16, and the position detecting signal thereof is fed into the vertical drive control apparatus 17, which in turn, outputs control signals to the drive units 14 so as to move the electromagnets 10 by an amount corresponding to $\Delta h$. This maintains the melt surface, i.e., the crystal-melt interface 6, invariably coniciding with the center lines $X_1$ of the electrmagnetics 10. Thus, a magnetic field strength of $H_2$ is invariably applied to the crystal-melt interface 6, and this allows the impurity concentration of the single crystal 7 during growth to be within the hatched region of $B_1$ to $B_2$, whereby the single crystal 7 of high quality can be produced.

As described above, in the process of pulling the single crystal, the vertical movement of the electromagnets 10 is controlled such that the crystal-melt interface 6 coincides with the center lines $X_1$ of the electromagnets 10. Consequently, a magnetic field strength of $H_2$ is invariably applied to the crystal-mewlt interface 6.

Next, such procedures will be described that, at every termination of pulling the single crystal, the inside of crucible 2 is cleaned before a new single crystal material is filled into the crucible 2. First, current-supply to the electromagnet 10 is interrupted to cease application of magnetic field to the melt 1. Thereafter, the drive units 14 are operated to rotate the vertical drive shafts 13 so as to move the electromagnet 10 in a direction 18, as shown in FIG. 3, to positions 19 at which the electromagnet 10 is fixed. Since the electromagnet 10 is fixed downward with respect to the chamber 11, disassembling and inspection of the chamber 11 and the crucible 2 are facilitated.

As described above, the single crystal pulling system according to the present invention provides the following advantages:

(a) The crystal-melt interface 6 of the melt 1 invariably coincides with the center line $X_1$ of the electromagnet 10, resulting in application of maximum magnetic field strength capable of suppressing the thermal convections 8 of the melt 1 so as to maintain the specified impurity concentration, whereby the single crystal 7 of high quality can be obtained.

(b) The crystal-melt interface 6 of the melt 1 invariably coincides with the center lines $X_1$ of the electromagnet 10, so that a magnetic field strength to be applied to the melt 1 can be reduced to the minimum which can obtain the specified impurity concentration. As a result, the electromagnet 10 requires minimal ampere-turns, and thus can be smaller in size and manufactured at lower cost.

(c) When cleaning inside the crucible 2, the electromagnet 10 can be completely separated from the chamber 11, so that inspection and cleaning of the crucible 2 can be extremely facilitated.

This invention may be practiced otherwise than as specifically described above, and other embodiments will be described hereinafter.

Figure 6:
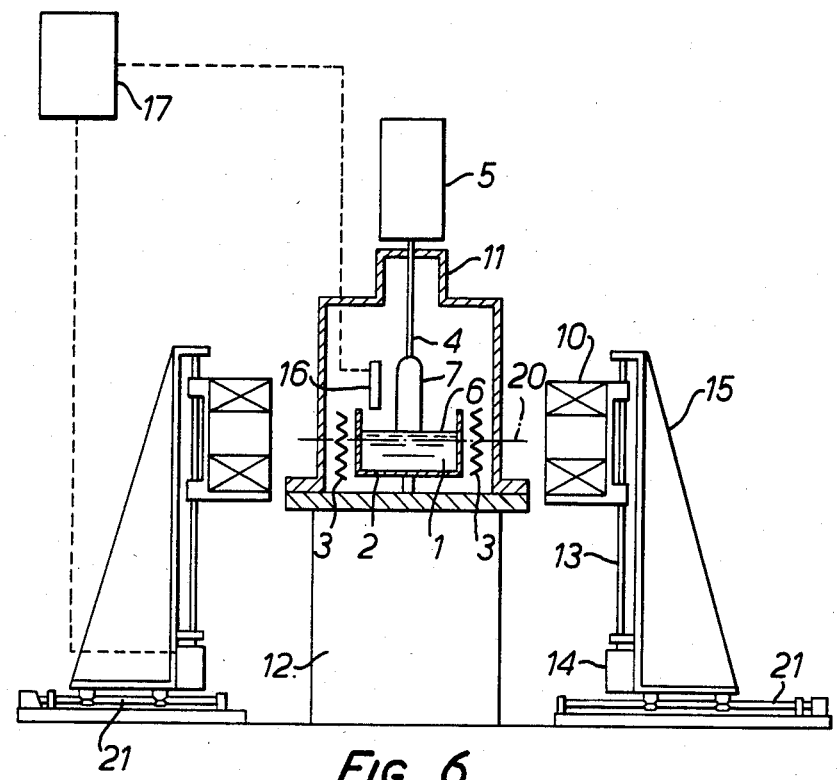
FIG. 6 and FIG. 7 are schematic diagrams respectively illustrating other embodiments according to the present invention.

FIG. 6 shows another embodiment of a single crystal pulling system according to the present invention, wherein electromagnets 10 of the split type are designed to apply a magnetic field in a direction 20 as shown in FIG. 6. The electromagnet 10 can also apply a magnetic field strength of $H_2$ shown in FIG. 2 to a crystal-melt interface 6. Here, vertical drive mechanisms of the electromagnets 10 are identical with those of FIG. 3. Reference numeral 21 designates plural traveling devices that horizontally shift the electromagnets 10 together with the vertical drive mechanisms. Such horizontal shift allows adjustment of the applied magnetic field strength distribution, and can also secure more spacious operation areas for disassembling and inspection of the chamber 11 and the crucible 2.

Figure 7:
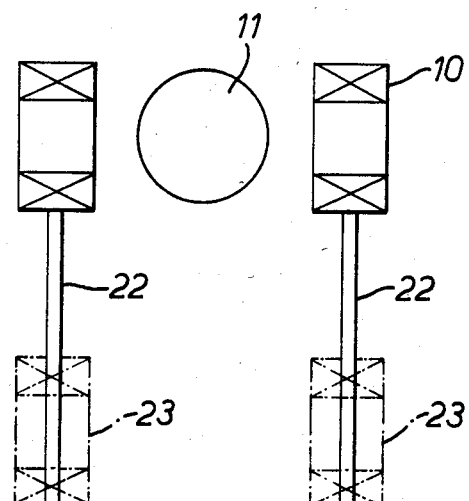

FIG. 7 is a plan view of another embodiment of a single crystal pulling system according to the present invention, wherein electromagnet 10 is identical with that of FIG. 6, and the magnetic field thereof is applied in a horizontal direction to the melt 1. The vertical drive mechanisms of the electromagnet 10 are also identical with those of FIG. 6, and are arranged on rails 22 installed on the floor so as to be horizontally shifted on the rails 22 when carrying out disassembling and inspection of the chamber 11 and the crucible 2, to positions 23 at which the electromagnet 10 is fixed during such operations. This allows the chamber 11 to be completely separated from the electromagnet 10, so that a more spacious operation area can be secured for cleaning the crucible 2 compared to that of FIG. 6. In this case the electromagnet 10 can be continuously energized in a continuous current mode.

As described above, according to the present invention, there can be provided a highly reliable single crystal pulling system wherein an electromagnet for applying magnetic field to a melt within a crucible is so arranged as to be moved at least in a vertical direction of vertical and horizontal directions, so that the minimal required magnetic field can be applied to a crystal-melt interface, and so that cleaning operations inside the crucible can be extremely facilitated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A single crystal pulling system comprising:
a single crystal pulling apparatus;
an electromagnet;
a magnet moving mechanism;
said single crystal pulling apparatus comprising a crucible containing a single crystal material melt, a heater for heating said crucible, and a constant speed pulling mechanism adapted to be coupled to a single crystal at a crystal-melt interface of said melt, said pulling apparatus adapted such that a seed crystal inserted in said melt is pulled from the melt at a specified constant speed by means of said constant speed pulling mechanism;
said electromagnet disposed at an outer periphery of said crucible so as to apply a predetermined strength of magnetic field to the crystal-melt interface of said melt; and
said magnet moving mechanism comprising means for moving said electromagnet at least in a vertical direction of vertical and horizontal directions with respect to said crucible based on a level of said crystal-melt interface in said crucible;
wherein said magnet moving mechanism comprises:
means for detecting a change in level of the crystal-melt interface of said melt; and means for moving said electromagnet in a vertical direction in accordance with the detected change in level of the crystal-melt interface of said melt, said moving means being connected to said detecting means.

2. A single crystal pulling system according to claim 1, wherein:
said detecting means comprises,
a sensor for detecting a change in the level of the crystal-melt interface of said melt, comprising means for measuring a change in electrostatic capacitance of said melt and the space thereabout; and
said moving means comprises,
a drive unit, and
a vertical drive control apparatus for feeding a motor drive signal based on the measured change in electrostatic capacitance to said drive unit in such a manner that the vertical position of said electromagnet is varied an amount corresponding to the measured change in electrostatic capacitance.

3. A single crystal pulling system according to claim 1 wherein:
said detecting means comprises a sensor for detecting a change in the level of the crystal-melt interface of said melt, comprising a laser-based measuring device,
said moving means comprises a drive unit, and
a vertical drive control apparatus for feeding a motor drive signal based on the measured level change to said drive unit such that the vertical position of said electromagnet is varied by an amount corresponding to said measured level change.

4. A single crystal pulling system comprising:
a single crystal pulling apparatus;
an electromagnet;
a magnet moving mechanism;
said single crystal pulling apparatus comprising a crucible containing a single crystal material melt, a heater for heating said crucible, and a constant speed pulling mechanism adapted to be coupled to a single crystal at a crystal-melt interface of said melt, said pulling apparatus adapted such that a seed crystal inserted in said melt is pulled from the melt at a specified constant speed by means of said constant speed pulling mechanism;
said electromagnet being a split type and disposed at opposite sides of said crucible so as to apply a predetermined strength of magnetic field to the crystal-melt interface of said melt; and
said magnet moving mechanism comprising means for moving said electromagnet at least in a vertical direction of vertical and horizontal directions with respect to said crucible based on a level of said crystal-melt interface in said crucible;
wherein said magnet moving mechanism comprises:
means for detecting a change in level of the crystal-melt interface of said melt; and
means for moving said electromagnet in a vertical direction in accordance with the detected change in level of the crystal-melt interface of said melt, said moving means being connected to said detecting means.

5. A single crystal pulling system according to claim 4, wherein:
said detecting means comprises,
a sensor for detecting a change in the level of the crystal-melt interface of said melt comprising mean for measuring a change in electrostatic capacitance of said melt and the space thereabout; and
said moving means comprises,
a drive unit, and
a vertical drive control apparatus for feeding a motor drive signal based on the measured change in electrostatic capacitance to said drive unit in such a manner that the vertical position of said electromagnet is varied by an amount corresponding to the measured change in electrostatic capacitance.

6. A single crystal pulling system according to claim 4, wherein:
said detecting means comprises,
a sensor for detecting a change in the level of the crystal-melt interface of said melt, comprising a laser-beam measuring device; and
said moving means comprises,
a drive unit, and
a vertical drive control apparatus for feeding a motor drive signal based on the measured level change to said drive unit such that the vertical position of said electromagnet is varied in correspondence with said measured level change.

* * * * *